United States Patent [19]

Moon et al.

[11] Patent Number: 6,114,920
[45] Date of Patent: Sep. 5, 2000

[54] SELF-CALIBRATING VOLTAGE-CONTROLLED OSCILLATOR FOR ASYNCHRONOUS PHASE APPLICATIONS

[75] Inventors: Un-Ku Moon, Corvallis, Oreg.; William B. Wilson, Macungie, Pa.

[73] Assignee: Lucent Technologies Inc., Murray Hill, N.J.

[21] Appl. No.: 09/130,295

[22] Filed: Aug. 6, 1998

Related U.S. Application Data

[63] Continuation-in-part of application No. 09/008,798, Jan. 20, 1998, Pat. No. 5,942,949.
[60] Provisional application No. 60/063,994, Oct. 14, 1997.

[51] Int. Cl.[7] .............................. H03B 5/20; H03L 7/099
[52] U.S. Cl. ............................ 331/179; 331/17; 331/34; 331/57; 331/143
[58] Field of Search ..................................... 331/1 R, 1 A, 331/8, 10, 11, 14, 16, 17, 18, 25, 34, 57, 111, 143, 177 R, 179; 327/156–159; 375/376; 455/260

[56] References Cited

U.S. PATENT DOCUMENTS

| | | |
|---|---|---|
| 4,503,401 | 3/1985 | Kyriakos et al. . |
| 4,563,657 | 1/1986 | Qureshi et al. . |
| 4,568,888 | 2/1986 | Kimura et al. ............................ 331/10 |
| 4,677,394 | 6/1987 | Vollmer . |
| 4,749,961 | 6/1988 | Kato et al. . |
| 4,980,652 | 12/1990 | Tarusawa et al. . |
| 5,168,245 | 12/1992 | Koskowich . |
| 5,182,528 | 1/1993 | Zuta ......................................... 331/1 A |
| 5,257,294 | 10/1993 | Pinto et al. .............................. 375/120 |
| 5,268,654 | 12/1993 | Furutani et al. . |
| 5,363,419 | 11/1994 | Ho . |
| 5,382,922 | 1/1995 | Gersbach et al. . |
| 5,625,325 | 4/1997 | Rotzoll et al. ............................ 331/16 |
| 5,648,744 | 7/1997 | Prakash et al. . |
| 5,696,468 | 12/1997 | Nise . |
| 5,942,949 | 8/1999 | Wilson et al. ............................. 331/17 |

FOREIGN PATENT DOCUMENTS

| | | |
|---|---|---|
| 0 442 461 | 8/1991 | European Pat. Off. . |
| 0 598 260 | 5/1994 | European Pat. Off. . |
| WO 97/09786 | 3/1997 | WIPO . |

*Primary Examiner*—David Mis
*Attorney, Agent, or Firm*—Steve Mendelsohn

[57] ABSTRACT

A circuit, such as a phase-lock loop (PLL), has an oscillator having a plurality of operating curves. During circuit auto-trim operations, the oscillator is automatically trimmed to an appropriate oscillator operating curve for use during normal circuit operations. In particular PLL embodiments, the PLL is a charge-pump PLL having a phase/frequency detector (PFD) that generates error signals based on comparing an input signal and a PLL feedback signal; a charge pump that generates amounts of charge corresponding to the error signals; a loop filter that accumulates the amounts of charge to generate a loop-filter voltage; and a voltage-controlled oscillator (VCO), where the VCO output signal is used to generate the PLL feedback signal. During normal PLL operations, the loop-filter voltage is applied to the voltage input of the VCO. During the PLL auto-trim operations, a state machine applies a sequence of digital control input values to the VCO to select different VCO operating curves until an appropriate operating curve for the present PLL application is found. In different embodiments, the state machine uses different signals to determine whether the center frequency of each operating curve in the sequence is above or below the desired nominal operating frequency for the VCO, and select one such operating curve for use in normal operations. The present invention can also be implemented in circuits having self-calibrating oscillators, other than PLLs.

5 Claims, 7 Drawing Sheets

SELF-CALIBRATING VOLTAGE-CONTROLLED OSCILLATOR FOR ASYNCHRONOUS PHASE APPLICATIONS

CROSS-REFERENCES TO RELATED APPLICATIONS

This is a continuation-in-part of U.S. application Ser. No. 09/008,798, filed on Jan. 20, 1998, now U.S. Pat. No. 5,942,949, as attorney docket number Moon 1-5, which claims the benefit of U.S. provisional application No. 60/063,994, filed on Oct. 14, 1997 as attorney docket no. Wilson 5.

BACKGROUND OF THE INVENTION

1. Field of the Invention

The present invention relates to electronics, and, in particular, to circuits, such a phase-lock loops, having oscillators.

2. Description of the Related Art

A phase-lock loop (PLL) is a circuit that generates a periodic output signal that has a constant phase relationship with respect to a periodic input signal. PLLs are widely used in many types of measurement, microprocessor, and communication applications. One type of phase-lock loop is the charge-pump PLL, which is described in Floyd M. Gardner, "Charge-Pump Phase-Lock Loops" IEEE *Trans. Commun.*, vol. COM-28, pp. 1849–1858, November 1980, the teachings of which are incorporated herein by reference.

FIG. 1 shows a block diagram of a conventional charge-pump phase-lock loop 100. Phase/frequency detector (PFD) 102 compares the phase $\theta_{IN}$ of the input signal $F_{IN}$ to the phase $\theta_{FB}$ of the feedback signal $F_{FB}$ and generates an error signal: either an up signal U (when $\theta_{IN}$ leads $\theta_{FB}$) or a down signal D (when $\theta_{FB}$ leads $\theta_{IN}$), where the width of the error signal pulse indicates the magnitude of the difference between $\theta_{IN}$ and $\theta_{FB}$.

Charge pump 104 generates an amount of charge equivalent to the error signal (either U or D) from PFD 102. Depending on whether the error signal was an up signal or a down signal, the charge is either added to or subtracted from the capacitors in loop filter 106. For purposes of this explanation, loop filter 106 has a relatively simple design, consisting of a capacitor $C_S$ in parallel with the series combination of a resistor R and a relatively large capacitor $C_L$. As such, loop filter 106 operates as an integrator that accumulates the net charge from charge pump 104. Other, more-sophisticated loop filters are of course also possible. The resulting loop-filter voltage $V_{LF}$ is applied to voltage-controlled oscillator (VCO) 108. A voltage-controlled oscillator is a device that generates a periodic output signal ($F_{OSC}$ in FIG. 1), whose frequency is a function of the VCO input voltage ($V_{LF}$ in FIG. 1). In addition to being the output signal from PLL 100, the VCO output signal $F_{OSC}$ is used to generate the feedback signal $F_{FB}$ for the closed-loop PLL circuit.

Optional input and feedback dividers (110 and 112) are placed in the input and feedback paths, respectively, if the frequency of the output signal $F_{OSC}$ is to be either a fraction or a multiple of the frequency of the input signal $F_{IN}$. If not, the input and feedback dividers can both be considered to apply factors of 1 to the input and feedback signals, respectively.

Due to the effect of the feedback path in PLL 100, the steady-state output signal $F_{OSC}$ will have a fixed phase relationship with respect to the input signal $F_{IN}$. Unless some phase offset is purposely added, the phases of the input and output signals will be synchronized with minimal offset.

Voltage-controlled oscillators, such as VCO 108 of FIG. 1, are devices that are often designed for a wide range of applications (e.g., signal frequencies from 40 KHz to 400 MHz) Such VCOs are often designed with a number of operating curves (i.e., voltage in vs. frequency out), where the frequency range of any one curve is only a fraction of the total operating range of the VCO. FIG. 2 shows a hypothetical set of eight operating curves for a VCO. A special digital control input N is used to select one of the operating curves. The process of selecting a VCO operating curve is called trimming.

For low-noise PLL applications, it is important for VCO 108 in FIG. 1 to have a relatively low gain. This implies that the slope of the selected VCO operating curve should be relatively low, such as those shown in FIG. 2. A particular PLL application may have a specific desired frequency or desired frequency range for the VCO. For example, in one application, the PLL may be needed to generate a nominal 100-MHz output signal. To achieve the desired PLL operations, the VCO is trimmed by selected the operating curve (e.g., N=3 in FIG. 2) whose center frequency $F_{CTR}$ is close to the desired nominal PLL output frequency.

Under ideal circumstances, corresponding operating curves (i.e., those having the same digital control input value) in all VCOs of the same design would have the same center frequencies and slopes. In this case, for a particular PLL application, the same VCO operating curve could be selected for each and every PLL instance. However, in the real world, due to variations during device fabrication, the characteristics of the operating curves will vary from VCO to VCO. For example, the operating curves shown in FIG. 2 could shift up or to the right, and even have differing slopes. Nor are they all necessarily linear. As a result, for some applications, the VCOs in different PLL instances may need to be trimmed with different digital control input values N to select the appropriate VCO operating curve for the desired output frequency.

Conventionally, each VCO is tested in the factory to characterize its set of operating curves to pre-determine which digital control input values are appropriate for different desired output frequencies. When a particular VCO is selected for a particular application, such as PLL 100 of FIG. 1, the appropriate trim setting (i.e., the particular digital control input value N that corresponds to the desired output frequency) is permanently burned into the device (e.g., by blowing fuse links). This factory testing and hard-wiring of the VCO adds to the costs of manufacturing the PLLs. It also limits the operating frequency range of each PLL to the permanently selected operating curve.

SUMMARY OF THE INVENTION

In one embodiment, the present invention is a self-trimming or self-calibrating phase-lock loop that automatically selects an appropriate VCO operating curve when the PLL is powered up. In general, the present invention is an integrated circuit having a circuit, where the circuit comprises an oscillator having a plurality of operating curves. During auto-trim operations, the oscillator is automatically trimmed to an appropriate oscillator operating curve for use during normal circuit operations.

In particular embodiments of the present invention, the circuit is a charge-pump PLL having a phase/frequency detector (PFD) that generates error signals based on comparing an input signal and a PLL feedback signal; a charge pump that generates amounts of charge corresponding to the error signals; a loop filter that accumulates the amounts of charge to generate a loop-filter voltage; and a voltage-controlled oscillator (VCO), where the VCO output signal is used to generate the PLL feedback signal. During normal PLL operations, the loop-filter voltage is applied to the voltage input of the VCO. During the PLL auto-trim operations, a state machine applies a sequence of digital control input values to the VCO to select different VCO operating curves until an appropriate operating curve for the present PLL application is found. In different embodiments, the state machine uses different signals to determine whether the center frequency of each operating curve in the sequence is above or below the desired nominal operating frequency for the VCO.

The present invention is not limited to charge-pump PLLs. As long as the PLL has a VCO with multiple operating curves and a frequency detector, the PLL can be automatically calibrated to select a VCO operating curve by breaking the PLL feedback loop, applying a reference signal to the VCO input, and adjusting the VCO digital control values. Nor is the invention limited only to PLLs.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 3:
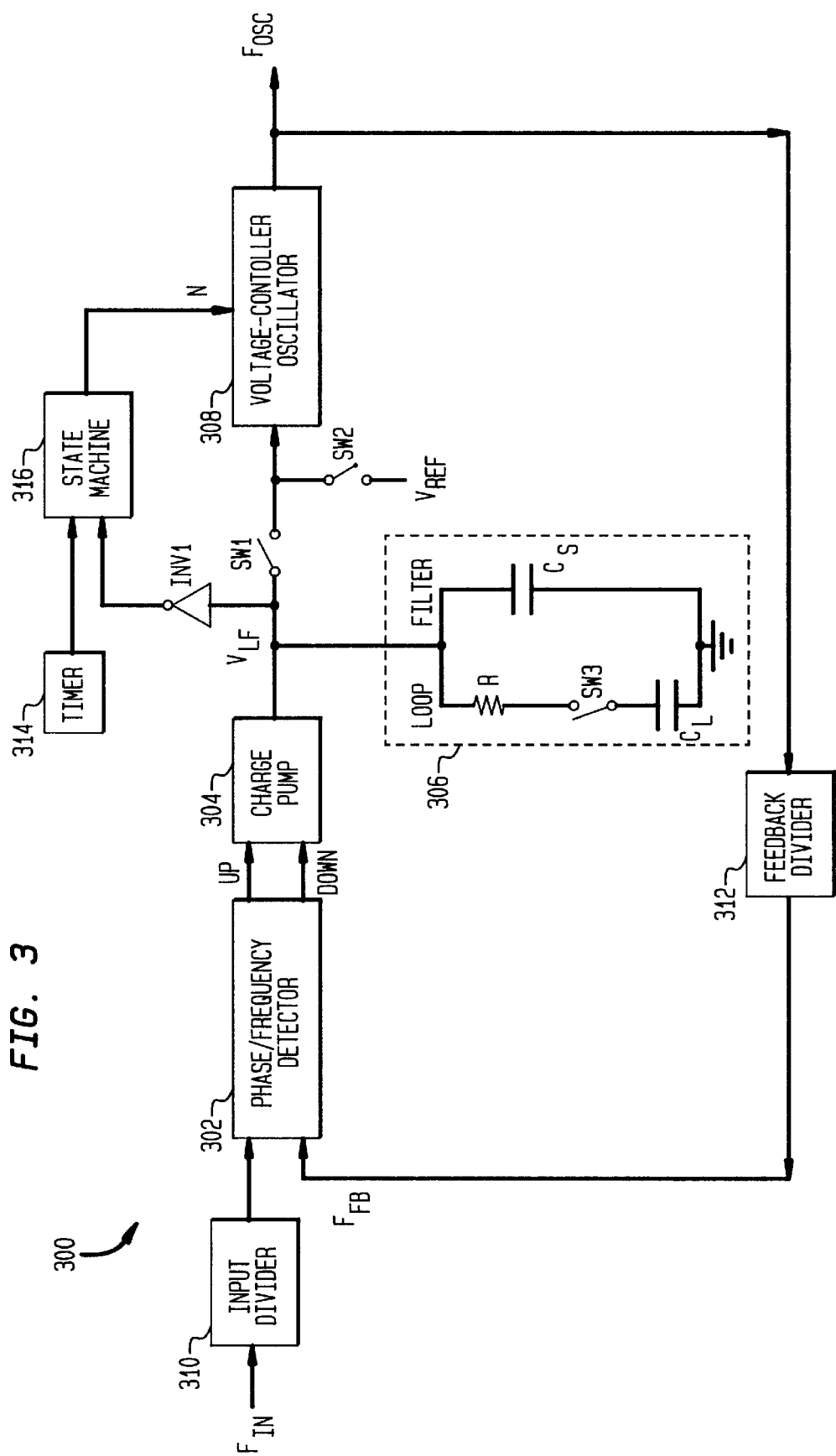
FIGS. 3–5 show block diagrams of charge-pump phase-lock loops, according to different embodiments of the present invention.

FIG. 3 shows a block diagram of a charge-pump phase-lock loop 300, according to one embodiment of the present invention. In PLL 300, phase/frequency detector 302, charge pump 304, voltage-controlled oscillator 308, input divider 310, and feedback divider 312 are analogous to the corresponding components of PLL 100 of FIG. 1. Loop filter 306 is similar to loop filter 106 of FIG. 1, except that a switch SW3 has been added between the resistor R and the large capacitor $C_L$. In addition, PLL 300 has switches SW1 and SW2, inverter INV1, timer 314, and state machine 316. These components are designed to enable PLL 300 to automatically select an appropriate trim setting whenever PLL 300 is powered on. In one embodiment, this auto-trim phase is implemented after the reset analog phase, but before the acquisition phase of a conventional PLL power-on sequence.

During the auto-trim phase, switches SW1 and SW3 are open and switch SW2 is closed. As a result, the reference voltage $V_{REF}$ is applied to the voltage input of VCO 308 rather than the loop-filter voltage $V_{LF}$, which is instead applied to the input of state machine 316 through inverter/comparator INV1. The reference voltage $V_{REF}$ is preferably the nominal center of the range of input voltages over which VCO 308 is designed to operate.

During the auto-trim phase, state machine 316 generates a sequence of digital control input values N that are input to VCO 308 to sequentially select different VCO operating curves. For each VCO operating curve, with reference voltage $V_{REF}$ applied, VCO 308 generates an output signal $F_{OSC}$ having a constant frequency. With the loop broken at switch SW1, charge pump 304 will eventually drive the loop-filter voltage $V_{LF}$ either to the negative supply rail (e.g., ground) or to the positive supply rail (e.g., $V_{DD}$), depending on whether the frequency of the feedback signal $F_{FB}$ is greater than or less than the frequency of the input signal $F_{IN}$ as adjusted, if at all, by input divider 310. The ultimate loop-filter voltage for a given VCO operating curve (i.e., either ground or $V_{DD}$) is referred to as the quiescent loop-filter voltage. This definition applies only during the auto-trim phase. During normal operations, the term may have another meaning.

Each digital control input value N in the sequence is applied for a period of time designated by timer 314. Preferably, each VCO operating curve is selected for a period of time sufficiently long for the loop-filter voltage $V_{LF}$ to converge substantially to the appropriate quiescent loop-filter voltage. If the frequency of the feedback signal $F_{FB}$ is greater than the frequency of the input signal (adjusted by input divider 310), then the loop-filter voltage $V_{LF}$ will eventually reach ground. Similarly, if the frequency of the feedback signal $F_{FB}$ is less than the frequency of the adjusted input signal, then the loop-filter voltage $V_{LF}$ will eventually reach $V_{DD}$.

The desired frequency of the VCO output signal $F_{OSC}$ is the frequency of the input signal $F_{IN}$ (ignoring for the time being any frequency multiplication or division resulting from dividers 310 or 312). By purposefully selecting digital control input values N, state machine 316 can eventually identify the two VCO operating curves that have center frequencies just above and just below the frequency of the input signal $F_{IN}$. Either one of these two operating curves can then be selected for use during normal PLL operations. In one embodiment, state machine 316 performs a linear search algorithm in which the values for the digital control input N are selected linearly starting at one end of the range of possible values (e.g., 0) and proceeding towards the other end of the range until the quiescent loop-filter voltage $V_{LF}$ flips from one side (e.g., ground) to the other (e.g., $V_{DD}$). In an alternative embodiment, state machine 316 performs a binary search algorithm in which each new digital control input value is selected midway between two previously selected values that yielded opposing quiescent loop-filter voltages, until two consecutive digital control values are found that yield opposing quiescent loop-filter voltages.

By opening switch SW3 during the auto-trim phase, the large capacitor $C_L$ is temporarily removed from the loop-filter operations and the loop-filter voltage $V_{LF}$ will settle to the appropriate quiescent voltage (i.e., either ground or $V_{DD}$) at a faster rate than when $C_L$ is present. This effectively reduces the time that each digital control input value N needs to be maintained to test each of the VCC) operating curves in the search sequence, thereby reducing the overall duration of the auto-trim phase. In addition, increasing the value of the charge pump current during the auto-trim phase can further speed up the convergence of the loop-filter voltage to the appropriate quiescent voltage level.

Figure 1:
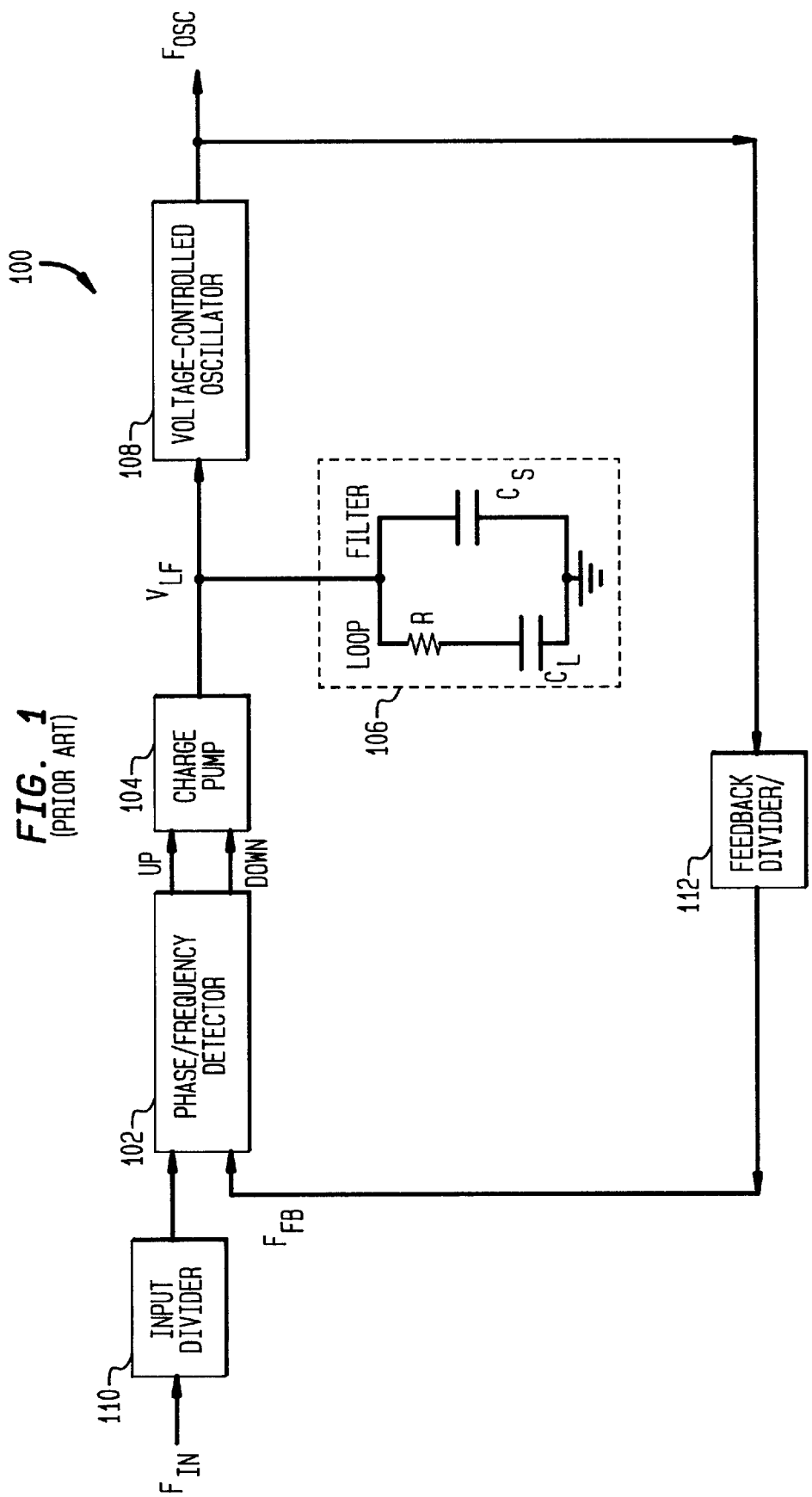
FIG. 1 shows a block diagram of a conventional charge-pump phase-lock loop.
Figure 2:
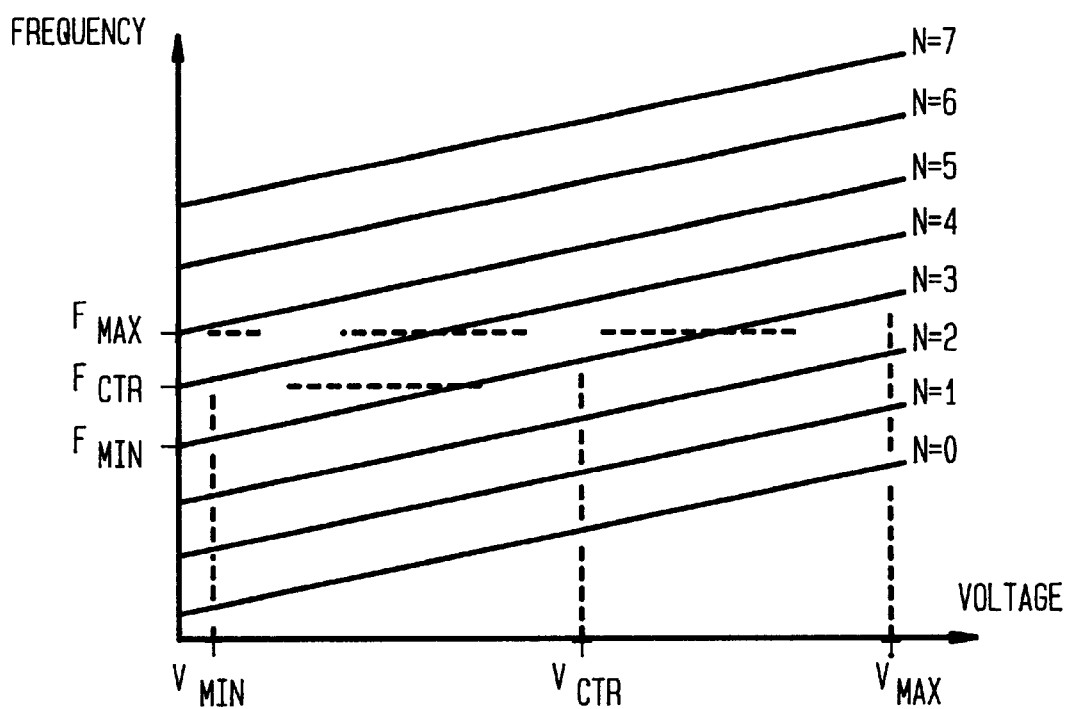
FIG. 2 shows a hypothetical set of operating curves for the voltage-controlled oscillator of the phase-lock loop of FIG. 1.

Once the auto-trim phase is complete, switches SW1 and SW3 are closed and switch SW2 is opened to enable normal PLL operations, which proceed analogously to PLL 100 of FIG. 1, in this case, using the digital control input value corresponding to the VCO operating curve selected by state machine 316 during the auto-trim phase as the trim setting for VCO 308. Inverter INV1 helps isolate state machine 316 from the loop-filter voltage $V_{LF}$ during normal PLL operations.

In an alternative implementation of PLL 300 of FIG. 3, PFD 302 is implemented as two separate detectors: a phase-only detector and a frequency-only detector, each of which has its own charge pump tied to the loop-filter voltage node. In this implementation, only the frequency-only detector needs to be used during the auto-trim phase.

Figure 4:
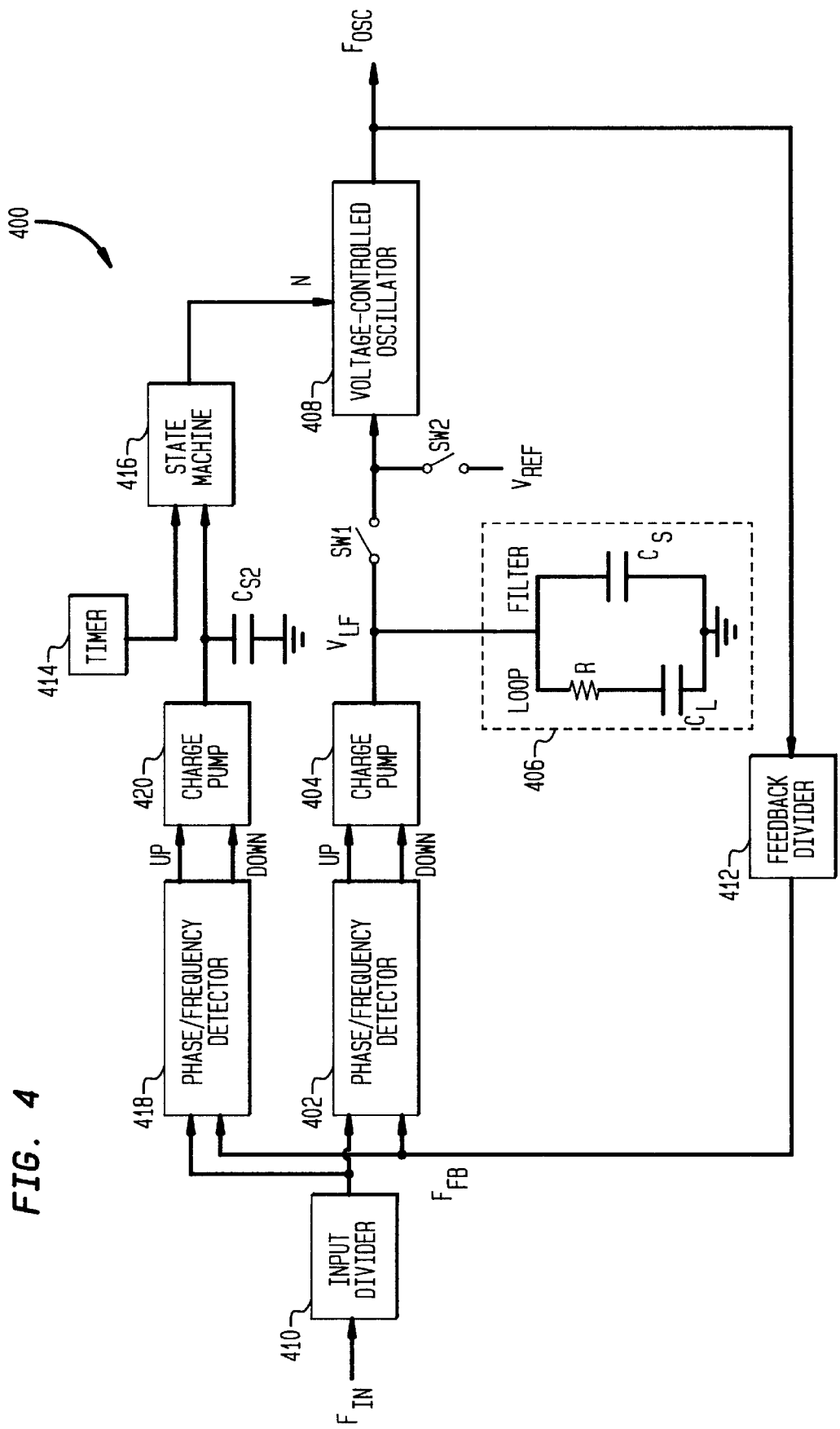

FIG. 4 shows a block diagram of a charge-pump phase-lock loop 400, according to an alternative embodiment of the present invention. In PLL 400, PFD 402, charge pump 404, loop filter 406, VCO 408, input divider 410, and feedback divider 412 are analogous to the corresponding components of PLL 100 of FIG. 1. Furthermore, timer 414 and state machine 416 are analogous to timer 314 and state machine 316 of PLL 300 of FIG. 3, in that timer 414 controls the timing of state machine 416, which applies a sequence of digital control input values N to VCO 408 to identify the two closest VCO operating curves for the desired application. Similarly, switches SW1 and SW2 of PLL 400 operate analogously to switches SW1 and SW2 of PLL 300 to apply the reference voltage $V_{REF}$ to the voltage input of VCO 408 during the initial auto-trim phase and the loop-filter voltage $V_{LF}$ during normal PLL operations.

PLL 400 differs from PLL 300 in a number of respects. First of all, PLL 400 has a separate PFD, charge pump and capacitor for generating an input voltage to state machine 416. In particular, PFD 418 generates up and down error signals (U and D) based on the phase and frequency relationships between the adjusted input signal and the feedback signal $F_{FB}$. Charge pump 420 generates amounts of charge based on the error signals from PFD 418 and capacitor $C_{S2}$ accumulates the net charge, which affects the input voltage to state machine 416.

Because PLL 400 does not rely on the loop-filter voltage $V_{LF}$ during the auto-trim phase, PLL 400 can be implemented without switch SW3 of FIG. 3, since there is no advantage in PLL 400 to removing capacitor $C_L$ during the auto-trim phase. In addition, PLL 400 can be implemented without inverter INV1, since state machine 416 is already isolated from the normal loop-filter voltage path. In fact, one of the motivations for the design of PLL 400 is to avoid inverter INV1, which can adversely affect the loop-filter voltage $V_{LF}$ during normal PLL operations.

Figure 5:
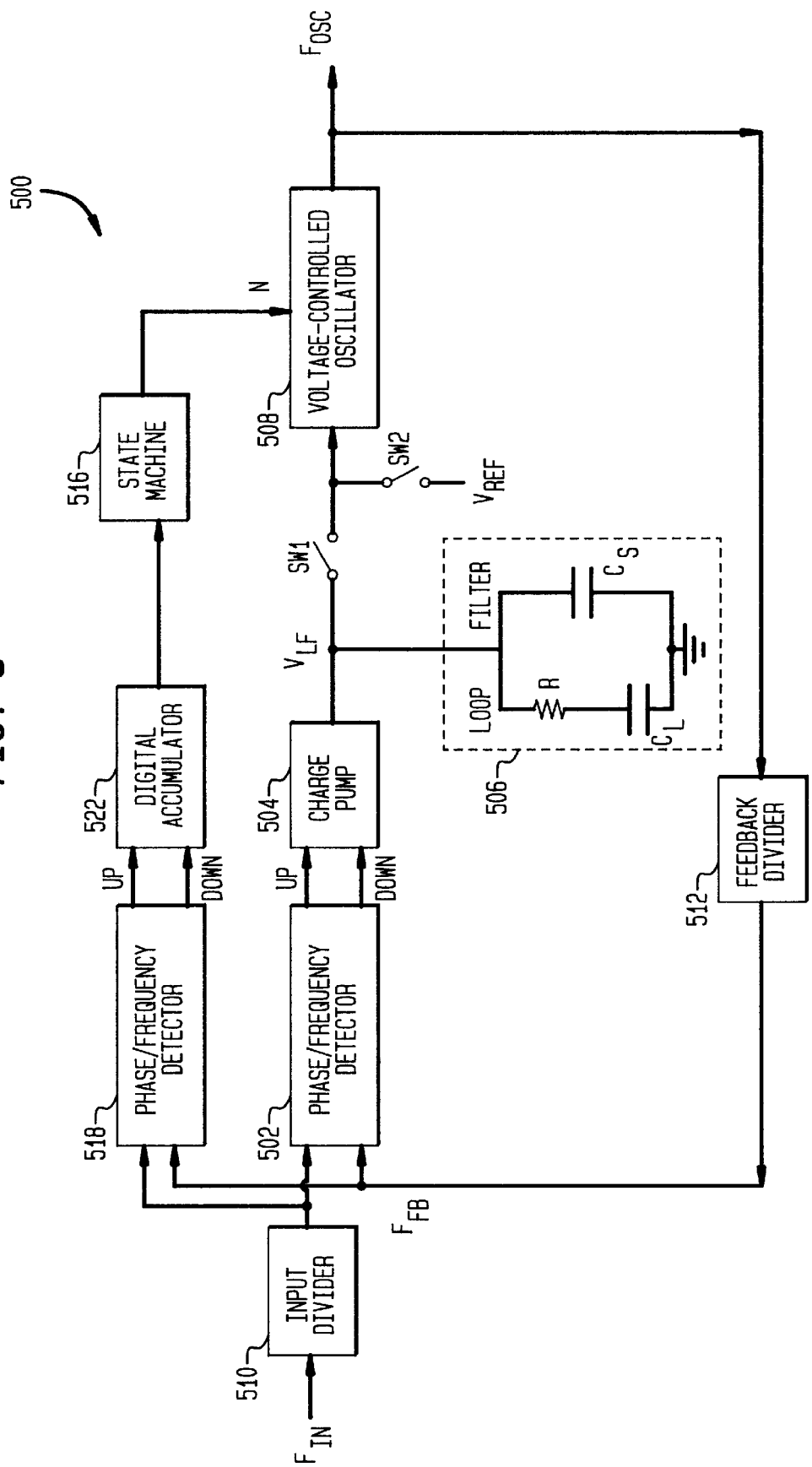

FIG. 5 shows a block diagram of a charge-pump phase-lock loop 500, according to yet another alternative embodiment of the present invention. In PLL 500, PFD 502, charge pump 504, loop filter 506, switches SW1 and SW2, VCO 508, input divider 510, and feedback divider 512 are analogous to the corresponding components of PLL 400 of FIG. 4.

In the digital embodiment of PLL 500, digital accumulator 522 replaces charge pump 420 and capacitor $C_{S2}$ of PLL 400. Digital accumulator 522 accumulates the digital up and down error signals from PFD 518 and generates a digital input to state machine 516. In that sense, digital accumulator 522 is the digital equivalent of charge pump 420 and capacitor $C_{S2}$ of PLL 400.

In addition, PLL 500 is preferably implemented without a timer, such as timer 414 of PLL 400. In this case, upper and lower limits are placed on the value contained within digital accumulator 522, so that the correct frequency error polarity is known when the accumulator value reaches either of the hard limits. The limits are preferably set at magnitudes such that each limit can be reached only under the appropriate corresponding condition (i.e., output frequency either too high or too low for an appropriate length of time). The use of these upper and lower limits eliminates the need for a separate timer, and appropriate selection of the limits can further reduce the overall duration of the auto-trim phase. In general, the duration of the timer used in the analog implementations of FIGS. 3 and 4, and magnitudes of the upper and lower limits used in the digital implementation of FIG. 5 are preferably set based on the minimum frequency difference between the input and output signals that the PLL needs to resolve.

In possible implementations of PLL 400 and 500, the second phase/frequency detector (418 and 518) can be replaced with a frequency-only detector, thereby potentially reducing cost, layout, and power requirements for the PLL.

The present invention provides advantages over the PLLs of the prior art. Since the VCO is trimmed automatically to the appropriate operating curve at power up, there is no need to trim the VCO in the factory. Nor is there a need to keep an inventory of different VCOs for different applications, since each VCO will be automatically trimmed to the appropriate trim setting for the particular application. In addition, since the VCO is not permanently trimmed, the PLL can be used and then re-used for different applications operating at different nominal frequencies. Each time the PLL is powered up, the VCO will be trimmed to the current appropriate trim setting. In addition, the PLL auto-trim operations may be repeated whenever an appropriate reset signal is applied to the PLL.

Another advantage of the present invention is that very few additional components need to be added to the conventional design of PLL 100 of FIG. 1 to achieve an instance of the auto-calibrating PLL of the present invention. For example, many conventional PLL designs already have a digital accumulator that can be used for digital accumulator 522 of FIG. 5. Similarly, most conventional PLLs already have switches SW1 and SW2 present. In addition, in PLLs where a separate frequency loop is used to aid acquisition, an extra frequency detector, charge pump, and capacitor may be present for use in PLL 400 of FIG. 4. Moreover, although timers and state machines may not already be present in conventional PLLs, because they are low-speed logic, the added cost is negligible compared to the savings.

Although the embodiments of FIGS. 3–5 show charge-pump PLLs, the present invention is not limited to charge-pump PLLs. In general, the present invention can be implemented for almost any ILL having a phase/frequency detector, an integrating loop filter, and a voltage-controlled oscillator. Furthermore, in alternative embodiments, the functions of switches SW1 and SW2 in FIGS. 3–5 can be incorporated inside the VCO as controlled by one of the digital control input values.

Up to this point in the Detailed Description, the invention has been described in the context of a self-calibrating PLL having an oscillator with a plurality of operating curves. Those skilled in the art will understand that the self-calibrating feature of the present invention can be applied to circuits that have such oscillators other than PLLs. As in the case of the PLLs, during auto-trim operations for the circuit, the oscillator is automatically trimmed to an appropriate oscillator operating curve for use during normal circuit operations.

Figure 6:
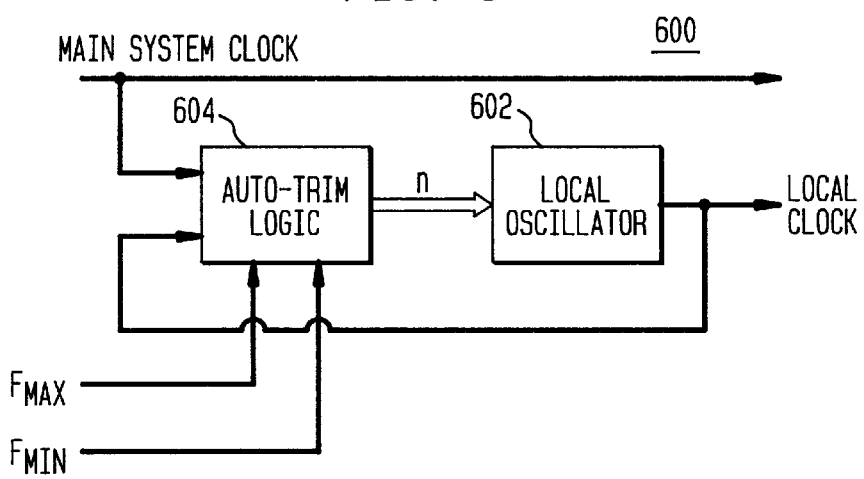
FIGS. 6–10 show block diagrams of circuits having self-calibrating oscillators, according to alternative embodiments of the present invention.

FIG. 6 shows a block diagram of a circuit 600 having a self-calibrating local oscillator 602, according to an alternative embodiment of the present invention. In circuit 600, local oscillator 602, which may be a small, inexpensive oscillator, may be used to provide the clock for a portion of a chip that is asynchronous to an input clock (e.g., the main system clock). Auto-trim logic 604, which is similar to the combination of frequency detector 518 and state machine 516 in PLL 500 of FIG. 5, compares the frequency of the main system clock to that of a feedback clock based on the local clock generated by local oscillator 602 and adjusts accordingly the n control bits of the digital control input value to local oscillator 602 until the local clock frequency is within the desired range defined by a k-bit specified minimum frequency value $f_{min}$ and a k-bit specified maximum frequency valve $f_{max}$ that are input to logic 604. After calibration, the frequency of the local clock will match the frequency of the main system clock (to within the specified range), but the phase of the local clock will be asynchronous with the phase of the main system clock.

Figure 7:
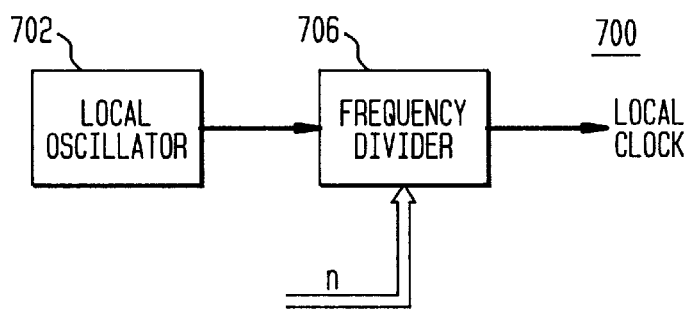

FIG. 7 shows a block diagram of a circuit 700 having a self-calibrating local oscillator 702, according to another alternative embodiment of the present invention. In circuit 700, local oscillator 702, which may be a crystal oscillator, is configured with a programmable frequency divider 706 to form a circuit that can generate a local clock whose frequency is a specified fraction of that generated by local oscillator 702.

Figure 8:
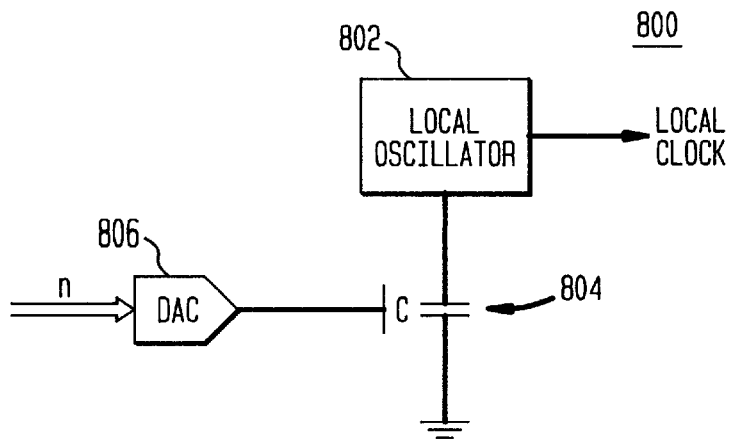

FIG. 8 shows a block diagram of a circuit 800 having a self-calibrating local oscillator 802, according to yet another alternative embodiment of the present invention. In circuit 800, local oscillator 802 is configured with varactor 804 to form an oscillating circuit whose output frequency is set by a capacitance. In circuit 800, the capacitance of varactor 804 is controlled by an n-bit digital control value that is converted into an analog control voltage for varactor 804 by digital-to-analog converter (DAC) 806. In other implementations of circuit 800, varactor 804 and DAC 806 may be replaced by other means for varying the capacitance of the input to local oscillator 802.

Figure 9:
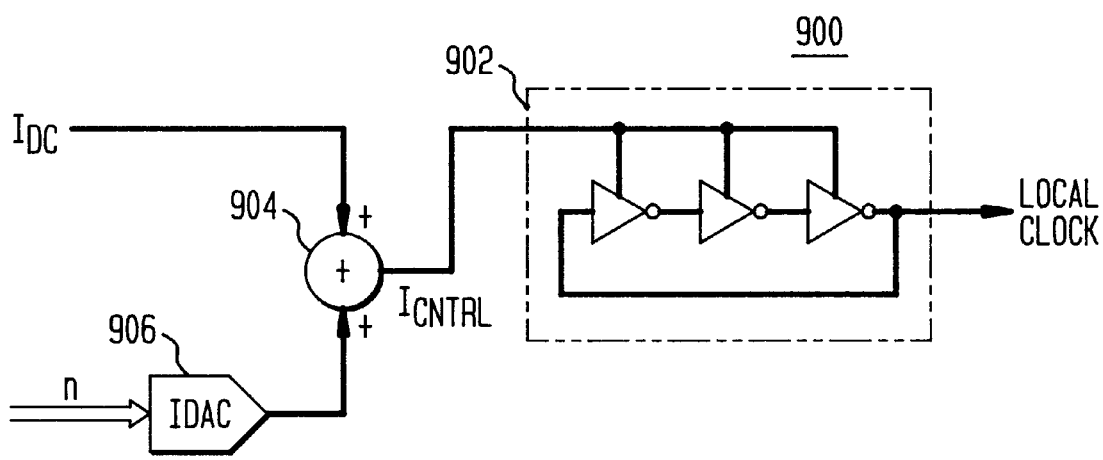

FIG. 9 shows a block diagram of a circuit 900 having a self-calibrating local oscillator 902, according to still another alternative embodiment of the present invention. In circuit 900, local oscillator 902 is a ring oscillator whose frequency is set by a control current $I_{CNTRL}$, which is the sum (904) of a DC current $I_{DC}$ and the output current from current DAC (IDAC) 906, which in turn is controlled by an n-bit digital control value. In other implementations of circuit 900, ring oscillator 902 may be replaced by a relaxation oscillator or other type of oscillator that works off of an input current control signal.

Figure 10:
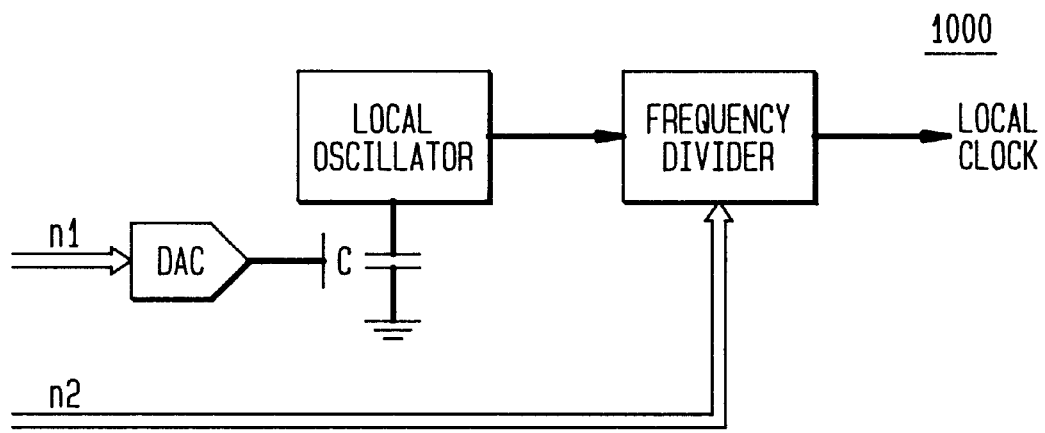

Those skilled in the art will understand that still other alternative embodiments of the present invention may be implemented by combining some of the different features of the circuits of FIGS. 6–9. FIG. 10, for example, shows a circuit based on a combination of features from the circuits of FIGS. 7 and 8.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. An integrated circuit having a self-calibrating oscillator circuit comprising:

(a) a voltage-controlled oscillator (VCO) having a plurality of VCO operating curves, wherein the VCO is configured to:

(1) receive a VCO control signal that is used to select one of the plurality of VCO operating curves; and (2) generate a VCO output signal whose frequency is a function of the selected VCO operating curve;

(b) auto-trim logic configured to:

(1) receive a system clock signal having a system clock frequency and a system clock phase, a specified minimum frequency control signal, a specified maximum frequency control signal, and, via a feedback path in the oscillator circuit, the VCO output signal; and (2) generate the VCO control signal;

(c) a current DAC (IDAC) configured to receive the VCO control signal; and (d) a summing node configured to generate a current control signal that is applied to the VCO to control the selection of the VCO operating curve, wherein:

the IDAC converts the VCO control signal into an IDAC output current;

the summing node adds the IDAC output current to a DC current signal to generate the current control signal for the VCO; and during auto-trim operations, the auto-trim logic compares the system clock frequency to the frequency of the VCO output signal and adjusts accordingly the VCO control signal until the frequency of the VCO output signal is within a specified range defined by the specified minimum frequency control signal and the specified maximum frequency control signal, thereby automatically trimming the VCO to the selected VCO operating curve, such that the frequency of the VCO output signal matches the system clock frequency to within the specified range, but the phase of the VCO output signal is asynchronous with the system clock phase.

2. The invention of claim 1, wherein, during the auto-trim operations, the auto-trim logic applies a sequence of VCO control signals to the VCO to select different VCO operating curves and the auto-trim logic selects an appropriate trim setting for the VCO for normal circuit operations.

3. The invention of claim 1, wherein the self-calibrating oscillator circuit further comprises a frequency divider configured to divide the frequency of the VCO output signal by a specified value to generate a divided output signal whose frequency is a specified fraction of the system clock frequency.

4. The invention of claim 1, wherein the VCO is a ring oscillator.

5. The invention of claim 1, wherein the VCO is a relaxation oscillator.

* * * * *